(12) United States Patent
Kapoor

(10) Patent No.: US 7,482,642 B2
(45) Date of Patent: Jan. 27, 2009

(54) BIPOLAR TRANSISTORS HAVING CONTROLLABLE TEMPERATURE COEFFICIENT OF CURRENT GAIN

(75) Inventor: Ashok K. Kapoor, Palo Alto, CA (US)

(73) Assignee: LSI Corporation, Milpitas, CA (US)

( * ) Notice: Subject to any disclaimer, the term of this patent is extended or adjusted under 35 U.S.C. 154(b) by 52 days.

(21) Appl. No.: 11/078,830

(22) Filed: Mar. 11, 2005

(65) Prior Publication Data

US 2006/0202307 A1    Sep. 14, 2006

(51) Int. Cl.
*H01L 23/62*    (2006.01)
(52) U.S. Cl. .................. 257/197; 257/47; 257/205; 257/273; 257/361; 257/362; 257/370; 257/373; 257/378; 257/E27.053; 257/E27.106
(58) Field of Classification Search .......... 257/E21.587, 257/E51.004, E27.053, E27.106, 47, 197, 257/205, 273, 361, 362, 370, 373, 378; 438/30, 438/48, 149, 151, 157, 161, 283, 202, 203, 438/240, 241
See application file for complete search history.

(56) References Cited

U.S. PATENT DOCUMENTS

| | | | | |
|---|---|---|---|---|
| 3,806,774 A | * | 4/1974 | Hartman et al. ............... | 257/76 |
| 4,151,006 A | * | 4/1979 | De Graaff et al. ............ | 438/365 |
| 5,006,477 A | * | 4/1991 | Farb ........................... | 438/231 |
| 2005/0186749 A1 | * | 8/2005 | Sato et al. ................... | 438/311 |
| 2006/0208261 A1 | * | 9/2006 | Kaneko et al. ................ | 257/77 |

* cited by examiner

*Primary Examiner*—Long K Tran
(74) *Attorney, Agent, or Firm*—Trexler, Bushnell, Giangiorgi & Blackstone, Ltd.

(57) ABSTRACT

A bipolar transistor which has a base formed of a combination of shallow and deep acceptors species. Specifically, elements such as Indium, Tellurium, and Gallium are deep acceptors in silicon, and are appropriate for such an application, in combination with boron as the shallow acceptor. The use of a deep acceptor for doping the base of the transistor has the benefit of providing a doping species, which increases in ionization as the temperature rises. At elevated temperatures, the fraction of, for example, indium which is ionized increases and it results in an increased Gummel number, driving down the current gain. In other words, the enhancement of the Gummel number between room temperature and an elevated temperature compensates for the increase in the ratio of collector and base currents due to band gap narrowing effects. Thus, a zero temperature coefficient bipolar transistor is provided.

13 Claims, 2 Drawing Sheets

BIPOLAR TRANSISTORS HAVING CONTROLLABLE TEMPERATURE COEFFICIENT OF CURRENT GAIN

BACKGROUND

Bipolar transistors are known to possess positive temperature coefficient for current gain, implying that the current gain increases as temperature increases. This is accompanied by a decrease in base-emitter voltage at elevated temperatures. Both of these factors combine to limit the performance of bipolar transistors, both at room temperature and at high temperatures. The increase in current gain is especially problematic for the design of output amplifiers, where the transistors are designed to operate very close to the extreme Ic and Vce limits. In many instances, the increase in current gain at high temperature results in over-designing at room temperature. Increase in current gain accompanied by a reduction is collector-emitter breakdown voltage $BV_{ceo}$, which is approximated by the ratio of collector-base breakdown voltage divided by the current gain raised to a power. Since $BV_{ceo}$ is a design parameter, a certain minimum value of this quantity has to be guaranteed by design at all temperatures. In order to meet the minimum value of current gain at the lowest temperature, a higher value of current gain has to be tolerated at the higher temperatures. As a result, the minimum value of the $BV_{ceo}$ is recorded at the highest temperature. This results in the design of the transistor with the value of $BV_{ceo}$ greater than the minimum required at room temperature, which leads to the sub-optimal design of the transistor at the room temperature, since $BV_{ceo}$ has a direct correlation with the cut off frequency of the transistor, which is the determining parameter for the high frequency performance of the transistor.

The physics behind this phenomenon of increase in current gain with temperature is well researched and understood. It has been proposed that the current gain tends to increase at high temperature because the temperature coefficients of the collector current and the base current have varying temperature coefficients. While the collector current is inversely proportional to the base Gummel number, the base current is inversely proportional to the emitter Gummel number to the first order. (Base Gummel number is the integral of the active dopants in the neutral base.) Due to the higher doping in the emitter region, greater band gap narrowing takes place in the emitter region as compared to the base region. This phenomenon results in a positive exponential coefficient for the current gain with activation energy equal to the difference in the band gap narrowing in the emitter region with respect to the base region. The reverse is true at low temperatures, i.e., current gain decreases as temperature decreases which also poses limits on the operation of bipolar transistors. The extent of band gap narrowing has been documented extensively in the industry (see, for example, J. C. S Woo and J. D. Plummer, "Optimization of silicon bipolar transistors for high current gain at low temperatures." IEEE Trans Electron Devices, Vol. 35, No. 8, August 1988, pp. 1311-1319). The resulting band gap narrowing in degenerately doped n and p type silicon has been empirically shown to follow the relationship:

$$\Delta Eg = 3.74 \times 10^{-3} * \log((N/N_0)^5 + 1),$$

where N is the doping density, $N_o$ is an empirical constant, equal to $9 \times 10^{17}/cm^3$ for N type silicon and $1 \times 10^{17}/cm^3$ for P type silicon. Assuming the doping in the emitter of $1 \times 10^{20}/cm^3$ and base doping of $2 \times 10^{17}/cm^3$, the resulting band gap lowering in the emitter is 37.4 meV, and the band gap narrowing in the base is a fraction of a mV, and a difference in band gap narrowing of 37 eV between emitter and base. The current gain temperature coefficient is also approximated by this activation energy, i.e., $$\beta \propto \exp(0.037/kT)$$

Using this expression, the current gain increase from 300 Kelvin (27 degrees Celsius) to 400 Kelvin (127 degrees Celsius) is found to be a factor of 1.42, i.e., an increase of 42% over this temperature range.

The present invention is directed at overcoming this limitation.

OBJECTS AND SUMMARY

An object of an embodiment of the present invention is to provide a bipolar transistor which has a temperature coefficient of current gain close to zero.

Another object of an embodiment of the present invention is to provide a bipolar transistor structure which provides an enhancement of the Gummel number between room temperature and an elevated temperature, where the enhancement compensates for an increase in the ratio of collector and base currents due to band gap narrowing effects.

Briefly, and in accordance with at least one of the foregoing objects, an embodiment of the present invention provides a bipolar transistor which has a base formed of a combination of shallow and deep acceptors species. Specifically, elements such as Indium, Tellurium, and Gallium are deep acceptors in silicon, and are appropriate for such an application, in combination with boron as the shallow acceptor. Preferably, the bipolar transistor is built on a silicon substrate, and is of the n-p-n type. Alternatively, the transistor can be of the p-n-p type. The use of a deep acceptor for doping the base of the transistor has the benefit of providing a doping species, which increases in ionization as the temperature rises. At elevated temperatures, the fraction of, for example, indium which is ionized increases and it results in an increased Gummel number, driving down the current gain. In other words, the enhancement of the Gummel number between room temperature and an elevated temperature compensates for the increase in the ratio of collector and base currents due to band gap narrowing effects. Thus, a zero temperature coefficient bipolar transistor is provided.

In an alternate embodiment of the invention, carbon atoms are implanted in silicon which has already been implanted with indium. Since indium atoms form a complex with carbon atoms in silicon with activation energy (114 mV) which is less than the activation energy of pure indium (160 mV) and yet greater than the thermal energy, it offers an alternate method of controlling the relative concentration of deep and shallow acceptor impurities in silicon by implanting a fixed dose of boron and indium atoms and a controlled dose of carbon atoms to enable conversion of a certain amount of indium atoms into indium carbon complex and result in bipolar transistor with current gain having a controllable temperature coefficient.

BRIEF DESCRIPTION OF THE DRAWINGS

The organization and manner of the structure and operation of the invention, together with further objects and advantages thereof, may best be understood by reference to the following description, taken in connection with the accompanying drawings, wherein.

DESCRIPTION

Figure 1:
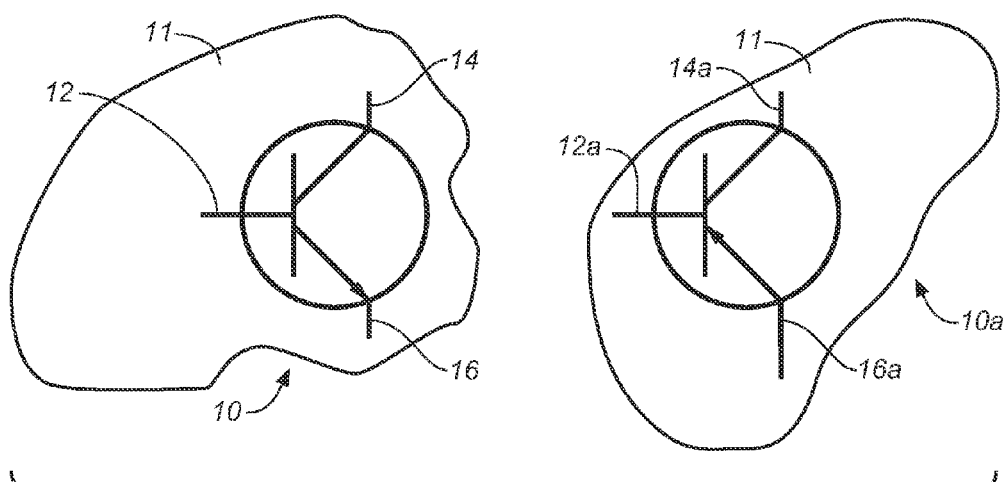
FIG. 1 illustrates a bipolar transistor having a base which is in accordance with an embodiment of the present invention.

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

FIG. 1 illustrates bipolar transistors 10, 10a (specifically, an n-p-n transistor 10 is shown as an example, having a base 12, a collector 14 and an emitter 16, and a p-n-p transistor 10a is shown as an example, having a base 12a, a collector 14a and an emitter 16a) which is in accordance with an embodiment of the present invention. Each of the bipolar transistors 10, 10a is built on a substrate 11 and has a temperature coefficient close to zero. More specifically, the bipolar transistor 10, 10a is configured such that it provides an enhancement of the Gummel number between room temperature and an elevated temperature, and the enhancement compensates for an increase in current gain, or the ratio of collector and base currents.

As mentioned above, transistor 10 is of n-p-n type. Preferably, the bipolar transistor is built on a silicon substrate.

In the bipolar transistor 10, 10a shown in FIG. 1, the base 12, 12a is formed using a combination of shallow and deep acceptors species. Elements such as Indium (In), Tellurium (Te), and Gallium are deep acceptors in silicon, and are appropriate for such an application, in combination with boron as the shallow acceptor. The deep acceptor may comprise at least one of Indium, Tellurium, and Gallium in the range of 1E15/cm3 and 1E18/cm3, and the shallow acceptor may comprise boron in the range of 1E15/cm3 and 1E18/cm3. The ionization energy levels of In and Te in silicon are 0.16, and 0.26 eV above the valence band. The diffusion rates of these two elements are of the same order of magnitude as the other dopants used for making semiconductor devices, such as phosphorous, arsenic, and boron. The solid solubility of In (and Te) is also comparable to other dopants. All of these factors make In suitable for conventional semiconductors processing. The use of a deep acceptor for doping the base 12, 12a of the transistor 10, 10a has the benefit of providing a doping species, which increases in ionization as the temperature rises. At elevated temperatures, the fraction of indium which is ionized increases and it results in increased Gummel number, driving down the current gain. Between 300 Kelvin and 400 Kelvin, the fraction of In which is ionized in silicon increases by greater than 2. An attempt to fabricate a npn bipolar transistor with only indium as the doping species for the base will result in >2 increase in base gummel number over this temperature range, and it will overcompensate for any increase in current gain due to band gap narrowing and other related effects, resulting in a transistor with negative temperature coefficient of current gain. Similar results are also expected from an npn transistor made with Te doped base.

Silicon is doped with boron by commonly known methods to those skilled in the art such as diffusion, ion implantation using boron or BF2, and other suitable methods. Similarly, In or Te doping in silicon is carried by thermal diffusion of ion implantation. By choosing the appropriate combination of the shallow acceptor (boron) and deep acceptor (Indium or Thallium), increase in Gummel number between 300K and 400K of approximately 1.4 is achieved.

The enhancement of the Gummel number between room temperature and the elevated temperature compensates for the increase in the ratio of collector and base currents due to band gap narrowing effects. Thus, a zero temperature coefficient bipolar transistor is created.

Figure 2:
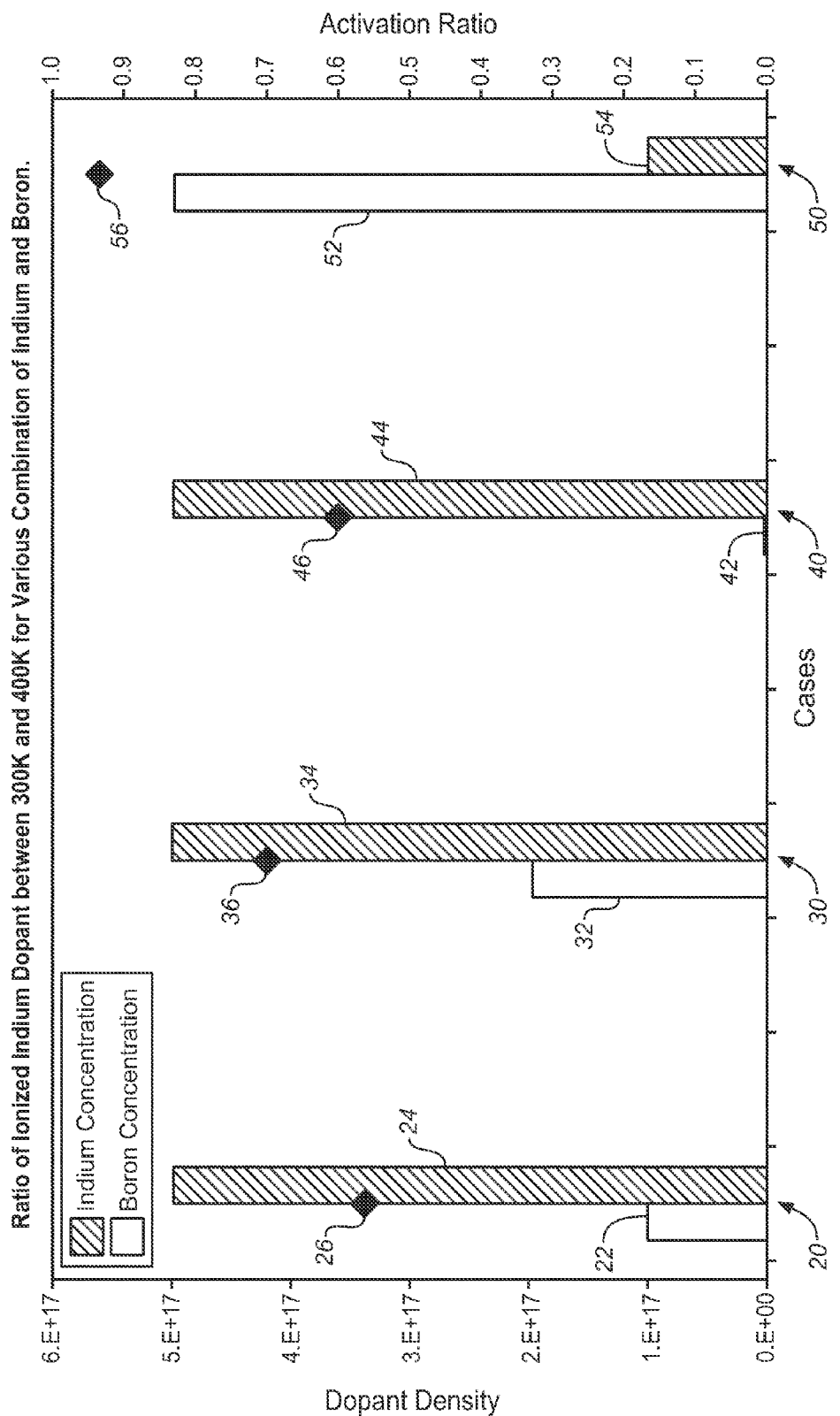
FIG. 2 is a graph which shows the results of calculations of ratio of indium activation at temperature of 300K to activation at 400 Kelvin for four different combinations of indium and boron concentrations.

A study of the variation in activation ratios of dopants between room temperature (300 K) and an elevated temperature (400 K) for varying concentrations of boron coexisting with Indium in silicon is presented in FIG. 2. Specifically, this figure shows the results of computer simulations carried out on four different cases with varying indium to boron concentrations. These results are shown in FIG. 2. For reference purposes, these four cases are marked as objects 20, 30, 40 and 50. It should be noted that these indexes do not refer to the concentration ratios of boron to indium. In FIG. 2: vertical bars 22, 24 and dot 26 relate to a first indium and boron concentration (identified in FIG. 2 with reference numeral 20); vertical bars 32, 34 and dot 36 relate to a second indium and boron concentration 30 (identified in FIG. 2 with reference numeral 30); vertical bars 42, 44 and dot 46 relate to a third indium and boron concentration 40 (identified in FIG. 2 with reference numeral 40); and vertical bars 52, 54 and dot 56 relate to a fourth indium and boron concentration 50 (identified in FIG. 2 with reference numeral 50). Vertical bars 22, 32, 42 and 52 relate to Boron, and vertical bars 24, 34, 44, 54 relate to Indium in each of the concentrations. The scale along the left vertical axis relates to dopant density (to be read using the vertical bars 22, 24, 32, 34, 42, 44, 52, 54 in the graph), and the scale along the right vertical axis is marked to represent the activation ratios of Indium associated with each combination for a temperature change of 300 Kelvin to 400 Kelvin (wherein the activation ratios for the four different concentrations 20, 30, 40, 50 are identified in the graph using the dots 26, 36, 46, 56). In other words, the graduations on the right-most y-axis show the ratio of ionized Indium atom concentration at 300 Kelvin to that at 400 Kelvin. This calculation is performed to demonstrate the variation in the current gain expected from using varying concentrations of Indium and boron as a doping species, which will compensate for the increase in current gain due to the band gap narrowing.

It is observed that for a small doping of indium (case 4, the right-most concentration (50) graphed in FIG. 2), the ratio of activation is nearly 0.9, while the ratio gets close to 0.5 in certain instances such as case 1 (the left-most concentration (20) graphed in FIG. 2) with large In concentration. A desired activation ratio of 0.7 (approximately equal to 1/1.42 or 1:1.42) can be achieved by fine tuning the ratio of boron and indium (see, for example, case 2 which is the concentration which is second from the left (30) in FIG. 2). These calculations confirm the fact that the desired ratio (1:1.42) of increased ionized impurity concentration from temperatures of 300K and 400K is possible, resulting in near constant beta over temperature.

With regard to the emitter 16, 16a, the emitter 16, 16a may be diffused in silicon or be made of polysilicon or polysilicon germanium, for example.

In an alternate embodiment of the invention, carbon atoms are implanted in silicon which has already been implanted with indium. More specifically, the base may include implanted carbon to a concentration of 1E15/cm3 and 1E19/cm3. Since indium atoms form a complex with carbon atoms in silicon with activation energy (114 mV) which is less than the activation energy of pure indium (160 mV) and yet greater than the thermal energy, it offers an alternate method of controlling the relative concentration of deep and shallow acceptor impurities in silicon by implanting a fixed dose of boron and indium atoms and a controlled dose of carbon atoms to enable conversion of a certain amount of indium atoms into indium carbon complex and result in bipolar transistor with current gain having a controllable temperature coefficient. In other words, the carbon atoms are implanted in silicon and they form a complex with the deep acceptor which has an activation energy which is different than the activation energy of the deep acceptor. This would also be true for a p-n-p type transistor (10a in FIG. 1) where the base region (12a in FIG. 1) contains deep donor atoms. Other ways of forming complexes to change the activation energy may be include interacting one active and one inert impurity.

Hence, both embodiments of the present invention provide a bipolar transistor with nearly zero temperature coefficient of current gain. It should be pointed out that the figures presented herein are for exemplary embodiments and do not represent a limiting implementation of the technique.

With regard to any references above to doping by ion implantation, it should be understood that there are other methods of introducing dopants in silicon, such as thermal diffusion from solid or gaseous sources, plasma immersion doping, etc.

It should be understood that the present invention is also intended to cover p-n-p type transistors, where the n-type base may be formed of deep donors such as S, Pt, and other suitable doping species, as well as n-p-n type transistors. It should be understood that the present invention is intended to cover III-V compounds also, along with Si, Ge and SiGe. Examples of III-V alloy include: GaAs, GaN, InP, GaInAsP, etc.

The present invention is also intended to cover cases where the semiconductor material is silicon germanium alloy, simply germanium or any other suitable material.

While embodiments of the present invention are shown and described, it is envisioned that those skilled in the art may devise various modifications of the present invention without departing from the spirit and scope of the appended claims.

What is claimed is:

1. A bipolar transistor comprising an emitter; a collector; and a base, wherein said base is formed of a combination of at least one shallow acceptor and at least one deep acceptor, wherein the deep acceptor comprises at least one of Indium, Tellurium, and Gallium in the range of 1E15/cm3 and 1E18/cm3, and the shallow acceptor comprises Boron in the range of 1E15/cm3 and 1E18/cm3, and wherein a ratio of ionization of the deep acceptor at a temperature of 300 Kelvin compared to ionization of the deep acceptor at a temperature of 400 Kelvin comprises 0.7.

2. A bipolar transistor as recited in claim 1, wherein the bipolar transistor is of n-p-n type.

3. A bipolar transistor as recited in claim 1, wherein the bipolar transistor is of p-n-p type.

4. A bipolar transistor as recited in claim 1, wherein the bipolar transistor is on a silicon substrate and is of the n-p-n type.

5. A bipolar transistor as recited in claim 1, wherein the emitter is diffused in silicon.

6. A bipolar transistor as recited in claim 1, wherein the emitter is made of polysilicon or polysilicon germanium.

7. A bipolar transistor as recited in claim 1, wherein carbon atoms are implanted in silicon thereby forming a complex with the deep acceptor which has an activation energy which is different than the activation energy of the deep acceptor.

8. A bipolar transistor as recited in claim 1, wherein the bipolar transistor is of the p-n-p type and the base contains deep donor atoms.

9. A bipolar transistor as recited in claim 1, wherein a complex is provided thereby changing an activation energy by interaction of one active and one inert impurity.

10. A bipolar transistor as recited in claim 1, wherein a fraction of deep acceptor which is ionized increases as a temperature increases, resulting in an increased Gummel number, which drives down a current gain.

11. A bipolar transistor as recited in claim 1, wherein said base includes implanted carbon thereby forming a complex with the deep acceptor which has an activation energy which is different than the activation energy of the deep acceptor.

12. A bipolar transistor as recited in claim 1, wherein the deep acceptor is configured to ionize at increased temperatures, thereby driving down a current gain of the bipolar transistor.

13. A bipolar transistor comprising an emitter; a collector; and a base, wherein said base is formed of a combination of at least one shallow acceptor and a deep acceptor, wherein the deep acceptor comprises Tellurium in the range of 1E15/cm3 and 1E18/cm3, and the shallow acceptor comprises Boron in the range of 1E18/cm3 and 1E18/cm3.

* * * * *